(12) United States Patent
Chinthu et al.

(10) Patent No.: US 12,537,526 B2
(45) Date of Patent: Jan. 27, 2026

(54) HIGH VOLTAGE POWER SWITCH

(71) Applicant: GlobalFoundries U.S. Inc., Malta, NY (US)

(72) Inventors: Siva Kumar Chinthu, Bangalore (IN); Palle Sundar Veerendranath, Bangalore (IN); Rajneesh Kumar, Noida (IN); Chaithanya Lakshmi Syba, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 94 days.

(21) Appl. No.: 18/542,900

(22) Filed: Dec. 18, 2023

(65) Prior Publication Data
US 2025/0202489 A1  Jun. 19, 2025

(51) Int. Cl.
*H03K 19/0185* (2006.01)
*H03K 17/10* (2006.01)
*H03K 19/173* (2006.01)

(52) U.S. Cl.
CPC ... *H03K 19/018521* (2013.01); *H03K 17/102* (2013.01); *H03K 19/1737* (2013.01)

(58) Field of Classification Search
CPC ......... H03K 19/018521; H03K 17/102; H03K 19/1737; H03K 19/018507; H03K 19/0185; H03K 19/1733; H03K 5/003; H03K 19/0175; H03K 19/017509; G11C 7/1057; G11C 7/1078; G11C 7/1084; G11C 7/1096; G06F 3/00; G06F 3/002
See application file for complete search history.

(56) References Cited

U.S. PATENT DOCUMENTS

| | | | |
|---|---|---|---|
| 5,321,324 A * | 6/1994 | Hardee | H03K 3/356017 326/62 |
| 6,472,737 B1 | 10/2002 | Corisis et al. | |
| 6,633,853 B2 | 10/2003 | Oshima et al. | |
| 7,785,281 B2 | 8/2010 | Scott | |
| 9,780,674 B2 | 10/2017 | Freeman et al. | |

FOREIGN PATENT DOCUMENTS

CN  107645157 A  1/2018

* cited by examiner

*Primary Examiner* — Jung Kim
(74) *Attorney, Agent, or Firm* — David Cain; Hoffman Warnick LLC

(57) ABSTRACT

A power switch, including: a PFET including a gate, a source coupled to a source voltage, and a drain for outputting a supply voltage; and a level shifter, wherein the level shifter includes: an input node for receiving an input voltage, wherein the input voltage includes first and second voltage levels; a supply node for receiving the supply voltage, wherein the supply voltage includes third and fourth voltage levels; and an output node for outputting an output voltage, wherein the output node is coupled to the gate of the PFET; wherein, when the input voltage is at the first voltage level, the output voltage is at the first voltage level and the PFET is in a conducting state; and wherein a voltage between the gate and drain of the PFET and a voltage between the gate and source of the FET do not exceed a maximum voltage of the PFET.

18 Claims, 6 Drawing Sheets

| Mode | VIN | VPP | VOUT | VHV | Comment |
|---|---|---|---|---|---|
| Forming | 1.8 V | 3.6 V | 1.8 V | ~ 3.6 V | Power switch on<br>Current flows from source to drain of PFET<br>SOA of PFET not exceeded |
| Writing (High Voltage) | 0V | 1.8V | 3.6V | 3.6 V | Power switch off<br>No current flow or DC path<br>SOA of PFET not exceeded |
| Writing (Low Voltage) | 0 V | 1.8 V | 1.8 V | 1.8 V | Power switch off<br>No current flow or DC path<br>SOA of PFET not exceeded |

| Mode | VIN | VPP | VOUT | VHV | Comment |
|---|---|---|---|---|---|
| Forming | 1.8 V | 3.6 V | 1.8 V | ~3.6 V | Power switch on<br>Current flows from source to drain of PFET<br>SOA of PFET not exceeded |
| Writing (High Voltage) | 0 V | 1.8 V | 3.6 V | 3.6 V | Power switch off<br>No current flow or DC path<br>SOA of PFET not exceeded |
| Writing (Low Voltage) | 0 V | 1.8 V | 1.8 V | 1.8 V | Power switch off<br>No current flow or DC path<br>SOA of PFET not exceeded |

| Mode | VIN | VINB | VS | VOUT | VPP | VHV | VPROT | VN1 | VN2 | Comment |
|---|---|---|---|---|---|---|---|---|---|---|
| Forming | 1.8 V | 0 V | 3.6V | 1.8 V | 3.6 V | ~3.6 V | 1.8 V | 3.6 V | 1.8 V | Power switch on Current flows from source to drain of PFET SOA of Transistors not exceeded |
| Write (High Voltage) | 0 V | 1.8 V | 3.6V | 3.6 V | 1.8 V | 3.6 V | 1.8 V | 1.8 V | 3.6 V | Power switch off No current flow or DC path SOA of Transistors not exceeded |
| Write (Low Voltage) | 0 V | 1.8 V | 1.8 V | 1.8 V | 1.8 V | 1.2 V | 0 V | 1.8 V | 0 V | Power switch off No current flow or DC path SOA of Transistors not exceeded |

FIG. 4

HIGH VOLTAGE POWER SWITCH

BACKGROUND

The present disclosure relates to integrated circuits (ICs) and, more particularly, to embodiments of a high voltage power switch with low power devices.

In integrated circuit (IC) devices, a voltage power switch may be used to output one of a plurality of different voltage levels to devices and/or circuits within an IC. For example, the different voltage levels may be used in a resistive random access memory (RRAM).

RRAM is an emerging technology for next generation non-volatile memory devices due to its enhanced properties such as fast operation speed, simple device structure, low power consumption, and good scalability potential. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1." RRAM cells operate under the principle that a dielectric, which is normally insulating, can be made to conduct through a filament or conduction path formed after the application of a forming voltage. The forming of a filament or conduction path is the forming process or forming operation of the RRAM.

After the forming process, one or more filament conductors are disposed across the resistive material layer. During a writing process, the filament conductors may be broken by applying a first writing voltage to the RRAM cell. After the filament conductors are broken, the resistance across the resistive material layer is at a high value and a low current or no current may be passed. A subsequent writing process may apply a second writing voltage to reconnect the broken filament conductors. By changing the filament conductors, a high or low resistance is stored in the memory cell that does not change when the power is removed.

A power voltage switch in an IC design may include one or more level shifters, where each level shifter may be configured to translate (i.e., shift) a voltage between two or more values. Power voltage switch designs have been developed that include low voltage transistors to reduce power consumption. However, some of the low voltage transistors in these power voltage switches may operate outside their safe operating area (SOA), which may damage or degrade the operation of the low power transistors.

SUMMARY

The illustrative aspects of the present disclosure are designed to solve the problems herein described and/or other problems not discussed.

Embodiments of the disclosure provide a power switch, including: a P-type field effect transistor (PFET) including a gate, a source coupled to a source voltage, and a drain for outputting a supply voltage; and a level shifter, wherein the level shifter includes: an input node for receiving an input voltage, wherein the input voltage includes first and second voltage levels; a supply node for receiving the supply voltage, wherein the supply voltage includes third and fourth voltage levels; and an output node for outputting an output voltage, wherein the output node is coupled to the gate of the PFET; wherein, when the input voltage is at the first voltage level, the output voltage is at the first voltage level and the PFET is in a conducting state; and wherein a voltage between the gate and the drain of the PFET and a voltage between the gate and the source of the FET do not exceed a maximum voltage rating of the PFET.

Other embodiments of the disclosure provide a power switch, including: a P-type field effect transistor (PFET) including a gate, a source coupled to a source voltage, and a drain for outputting a first supply voltage; a level shifter, wherein the level shifter includes: an input node for receiving an input voltage, wherein the input voltage includes first and second voltage levels; a supply node for receiving a second supply voltage, wherein the second supply voltage includes third and fourth voltage levels; and an output node for outputting an output voltage, wherein the output node is coupled to the gate of the PFET; and a voltage selection circuit for providing the second supply voltage; wherein, when the input voltage is at the first voltage level, the output voltage is at the first voltage level and the PFET is in a conducting state; and wherein a voltage between the gate and the drain of the PFET and a voltage between the gate and the source of the PFET do not exceed a maximum voltage rating of the PFET.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 4 depicts a table summarizing the operation of the high voltage power switch of FIG. 3 during RRAM forming and writing processes according to embodiments of the disclosure.

Figures 1, 2:
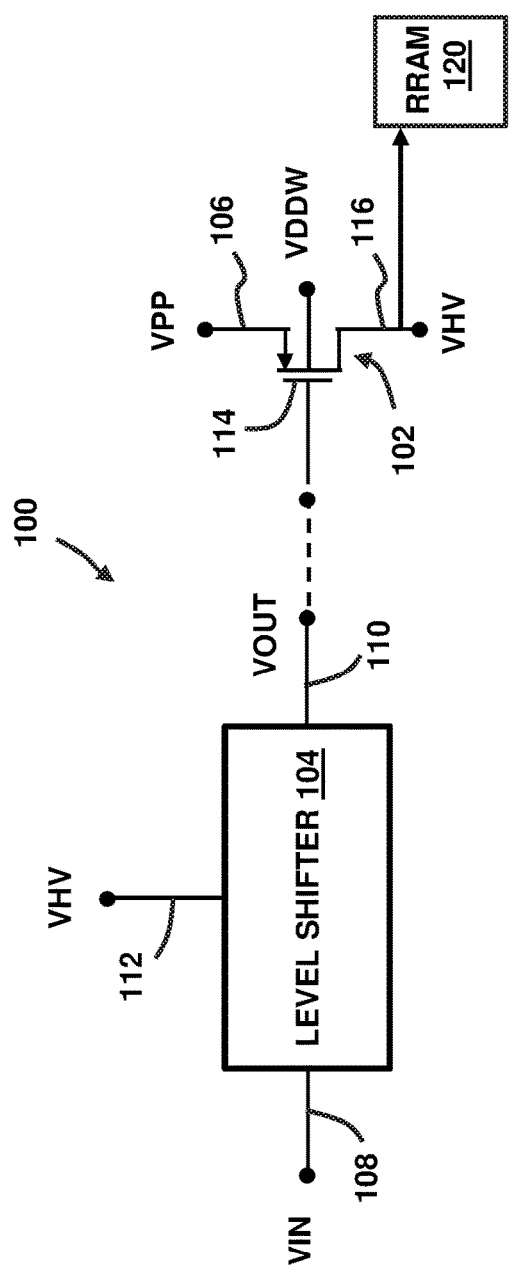
FIG. 1 depicts a high voltage power switch according to embodiments of the disclosure.
FIG. 2 depicts a table summarizing the operation of the high voltage power switch of FIG. 1 during resistive random access memory (RRAM) forming and writing processes according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

As mentioned above, a power voltage switch in an IC design may include one or more level shifters, where each level shifter may be configured to translate (i.e., shift) a voltage between two or more values. Power voltage switch designs have been developed that include low voltage transistors to reduce power consumption. However, some of the low voltage transistors in these power voltage switches may operate outside their safe operating area (SOA), which may damage or degrade the operation of the low power transistors.

FIG. 1 depicts a high voltage power switch 100 (hereafter power switch 100) according to embodiments of the disclosure. The power switch 100 (as well as other embodiments of power switches described below) may include one or more transistors including both P-type transistors and N-type transistors. For purposes of illustration, the P-type transistors and N-type transistors are described below and illustrated in the figures as being metal oxide semiconductor field effect transistors (MOSFETs) and, particularly, P-type field effect transistors (PFETs) and N-type field effect transistors (NFETs), respectively. In FIG. 1, for example, the power switch 100 includes a low power switching PFET 102 (also referred to herein as PFET 102). A MOSFET refers to a transistor with a semiconductor channel region positioned laterally between a source region and a drain region and with a gate (e.g., including a gate dielectric-gate conductor stack) adjacent to the channel region. However, it should be understood that the figures and discussion thereof are not intended to be limiting. For example, alternatively, a similar circuit structure could be formed using bipolar junction transistors (BJTs) and, particularly, PNP BJTs and NPN BJTs. The transistors may, for example, all have the same maximum voltage rating, and, for reduced power consumption, the maximum voltage rating can be relatively low as specified by the transistor data sheet. For example, the transistors can have a maximum voltage rating of 3.3V or lower. In some embodiments, the transistors can have a maximum voltage rating of 1.8V, 1.5V or 0.8V. To minimize manufacturing complexity, the transistors may also all be symmetric. That is, they can be designed so that the source region and the drain region are the same (e.g., same size, doping, etc.) except for minor process variations and so that the same maximum voltage rating applies to the gate to source voltage (VGS), the gate to drain voltage (VGD), and the source to drain voltage (VSD). As discussed in greater detail below, the power switch 100 (as well as other embodiments of power switches described herein) may specifically be configured to ensure operation of the power switch is achieved without violating any of these maximum voltage ratings in order to avoid device stress and ensure continuous operation within the SOA.

According to embodiments, the power switch 100 may include a level shifter 104 that is configured to output different voltage levels (e.g., for use in a resistive random access memory (RRAM)). Based on the output voltage VOUT of the level shifter 104 and a voltage VPP applied to a source 106 of the PFET 102, the power switch 100 may be configured to output a forming voltage (e.g., ~3.6 V (3.6 V-the source to drain voltage VSD of the PFET transistor 102)), a high writing voltage (e.g., 3.6 V), or a low writing voltage (e.g., 1.8 V). As described herein, the PFET 102 is a low power device that has a maximum voltage rating (e.g., 1.8V), although other maximum voltage ratings may be possible depending, for example, on the operating voltages of the level shifter 104 and power switch 100.

The level shifter 104 includes an input node 108 for receiving a variable input voltage VIN, an output node 110 for supplying an output voltage VOUT, and a voltage supply node 112 for receiving a variable power supply voltage VHV, where different input voltages VIN and power supply voltages VHV are applied to the input node 108 and power supply node 112 during RRAM forming, high voltage writing, and low voltage writing processes. For example, the input node 108 of the level shifter 104 may receive an input voltage VIN of 1.8 V (forming) or 0 V (high voltage writing, low voltage writing) and the voltage supply node 112 may receive a power supply voltage VHV of ~3.6 V (forming), 3.6 V (high voltage writing), or 1.8 V (low voltage writing). In response, the level shifter 104 is configured to supply an output voltage VOUT of 1.8 V (forming), 3.6 V (high voltage writing), or 1.8 V (low voltage writing). For example, when the input voltage VIN is 1.8 V, the level shifter 104 passes that voltage to the output node 110 as an output voltage VOUT of 1.8 V. However, when the input voltage VIN is 0 V, the level shifter 104 passes the power supply voltage VHV to the output node 110 as an output voltage VOUT of 3.6 V (high voltage writing) or 1.8 V (low voltage writing).

A voltage VPP is applied to a source 106 of the PFET 102 of the power switch 100. The output voltage VOUT of the level shifter 104 is applied to a gate 114 of the PFET 102. The drain 116 of the PFET 102 is coupled to the voltage VHV, which is provided to an RRAM 120. The PFET 102 is biased by a fixed voltage VDDW, which may be set at a voltage level equal to the maximum voltage rating of the PFET 102 (e.g., VDDW=1.8V). The voltage VPP applied to the source 106 of the PFET 102 and the voltage VOUT from the level shifter 104 may vary depending on the RRAM forming and writing processes. For example, the source of the PFET 102 may receive a voltage VPP of 3.6 V (forming), 1.8 V (high voltage writing), or 1.8 V (low voltage writing) and, as detailed above, the output voltage VOUT of the level shifter 104 applied to the gate 116 of the PFET 102 may be 1.8 V (forming), 3.6 V (high voltage writing), or 1.8 V (low voltage writing). To this extent, the PFET 102 is in a conducting state (ON) during the forming process and current flows from the source 106 to the drain 116 of the PFET 102, while the PFET 102 is in a non-conducting state (OFF) during the high voltage writing and low voltage writing processes. It should be noted that during each of the forming, high voltage writing, and low voltage writing processes, the maximum voltage rating of 1.8V of the PFET 102 is not exceeded. The operation of the power switch 102 is summarized in the table illustrated in FIG. 2.

Figure 3:
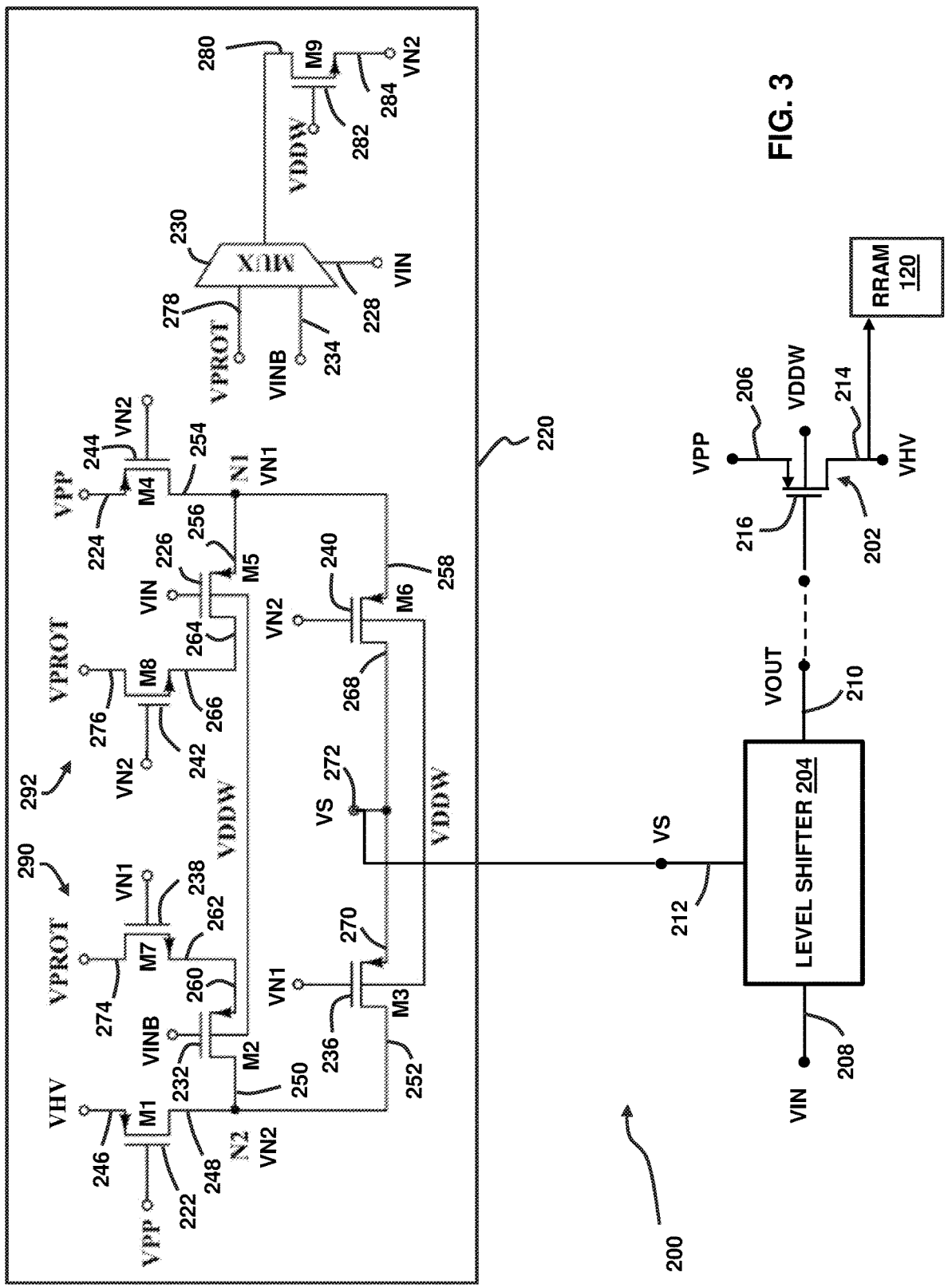
FIG. 3 depicts a high voltage power switch according to embodiments of the disclosure.

FIG. 3 depicts a high voltage power switch 200 (hereafter power switch 200) according to additional embodiments of the disclosure. Similar to the power switch 100 described above, the power switch 200 includes a PFET switching transistor 202 (also referred to herein as PFET 202) and a level shifter 204 that is configured to provide different voltage levels (e.g., for use in an RRAM 120). For example, the power switch 200 may be configured to output a forming voltage (e.g., ~3.6 V (3.6 V–the source to drain voltage VSD of the PFET switch transistor 202)), a high writing voltage (e.g., 3.6 V), or a low writing voltage (e.g., 1.2 V), based on the output voltage VOUT of the level shifter 204 and a voltage VPP applied to a source 206 of the PFET 202. Note that the low writing voltage (e.g., 1.2 V) in this case is different than that provided by the power switch 100 (e.g., 1.8 V).

The level shifter 204 includes an input node 208 for receiving a variable input voltage VIN, an output node 210 for outputting an output voltage VOUT, and a voltage supply node 212 for receiving a variable power supply voltage VS, where different input voltages VIN and power supply voltages VS are applied to the input node 208 and power supply node 212 during RRAM forming, high voltage writing, and low voltage writing processes. For example, the input node 208 of the level shifter 204 may receive an input voltage VIN of 1.8 V (forming), 0 V (high voltage writing), and 0 V (low voltage writing) and the voltage supply node 212 may receive a power supply voltage VS of 3.6 V (forming), 3.6 V (high voltage writing), or 1.8 V (low voltage writing). In response, the level shifter 204 is configured to supply an output voltage VOUT of 1.8 V (forming), 3.6 V (high voltage writing), and 1.8 V (low voltage writing). When the input voltage VIN is 1.8 V, the level shifter 204 passes that voltage to the output node 210 as an output voltage VOUT of 1.8 V. However, when the input voltage VIN is 0 V, the level shifter 104 passes the power supply voltage VHV to the output node 210 as an output voltage VOUT of 3.6 V (high voltage writing) or 1.8 V (low voltage writing).

A voltage VPP is applied to a source 206 of the PFET 202 of the power switch 200. The output voltage VOUT of the level shifter 204 is applied to a gate 214 of the PFET 202. The drain 216 of the PFET 202 is coupled to the power supply voltage VHV. The PFET 202 is biased by a fixed voltage VDDW, which may be set at a voltage level equal to the maximum voltage rating of the PFET 202 (e.g., VDDW=1.8V). The voltage VPP applied to the source 206 of the PFET 202 and the voltage VOUT from the level shifter 204 vary depending on the RRAM forming and writing processes. For example, the source of the PFET 202 may receive a voltage VPP of 3.6 V (forming), 1.8 V (high voltage writing) or 1.8 V (low voltage writing) and, as detailed above, the output voltage VOUT of the level shifter 204 applied to the gate 216 of the PFET 202 may be 1.8 V (forming), 3.6 V (high voltage writing), and 1.8 V (high voltage writing). To this extent, the PFET 202 is on during the forming process and current flows from the source 206 to the drain 216 of the PFET 202, while the PFET 202 is off during the high and low voltage writing processes. It should be noted that during each of the forming, high voltage writing, and low voltage writing processes, the maximum voltage rating of 1.8V of the PFET 202 is not exceeded. The structure and operation of the level shifter 204 (as well as the level shifter 104) is disclosed, for example, in patent application Ser. No. 18/306,541, filed Apr. 25, 2023, which is incorporated herein in its entirety.

As shown in FIG. 3, the power switch 200 further includes a high voltage selection circuit 220 (hereafter selection circuit 220) for providing the voltage VS to the power supply node 212 of the level shifter 204. According to embodiments, the selection circuit 220 includes a plurality of low power transistors (e.g., maximum voltage rating of 1.8V). As with the PFET 202, the maximum voltage rating (e.g., 1.8V) of the transistors in the selection circuit 220 during each of the forming, high voltage writing, and low voltage writing processes is not exceeded. The operation of the power switch 200 is summarized in the table illustrated in FIG. 4.

The selection circuit 220 includes a plurality of PFETs M1-M6 and a plurality of NFETs M7-M9. The voltage VPP is applied to the gate 222 of the PFET M1 and the source 224 of the PFET M4. The voltage VIN is applied to the gate 226 of the PFET M5. The voltage VIN is also applied to a select line 228 of a multiplexer (MUX) 230. The inverse of the voltage VIN, namely VINB, is applied to the gate 232 of the PFET M2 and to an input 234 of the MUX 230. A voltage VN1 (e.g., the voltage at node N1) is applied to the gate 236 of the PFET M3 and to the gate 238 of the NFET M7. A voltage VN2 (e.g., the voltage at node N2) is applied to the gate 240 of the PFET M6, the gate 242 of the NFET M8, and the gate 244 of the PFET M4. The PFETs M2, M3, M5, and M6 are biased by a fixed voltage VDDW, which may be set at a voltage level equal to the maximum voltage rating of the PFET 202 (e.g., VDDW=1.8V).

A variable power supply voltage VHV is applied to the source 246 of the PFET M1. The drain 248 of the PFET M1 is coupled to the drain 250 of the PFET M2 and the drain 252 of the PFET M3. The drain 254 of the PFET M4 is coupled to the source 256 of the PFET M5 and the source 258 of the PFET M6. The source 260 of the PFET M2 is coupled to the source 262 of the NFET M7. The drain 264 of the PFET M5 is coupled to the source 266 of the NFET M8. The drain 268 of the PFET M6 is coupled to the source 270 of the PFET M3 and to an output node 272 for outputting the voltage VS that is applied to the voltage supply node 212 of the level shifter 204.

According to embodiments, a protection voltage VPROT is provided to a first protection circuit 290 (NFET M7 and the PFET M2) and a second protection circuit 292 (NFET M8 and the PFET M5). The protection voltage VPROT is applied to the drain 274 of the NFET M7 and the drain 276 of the NFET M8. The first and second protection circuits 290 and 292 maintain the voltages VN1, VN2 at nodes N1 and N2 at a level that ensures that the maximum voltage rating (1.8 V) of the PFETs M1-M6 (as well as the NFETs M7 and M8) is not exceeded.

The protection voltage VPROT is also applied to an input 278 of the MUX 230. The output of the MUX 230 is applied to a drain 280 of the NFET M9. The fixed voltage VDDW is applied to the gate 282 of the NFET M9. The voltage VN2 is applied to the source 284 of the NFET M9.

Figure 5:
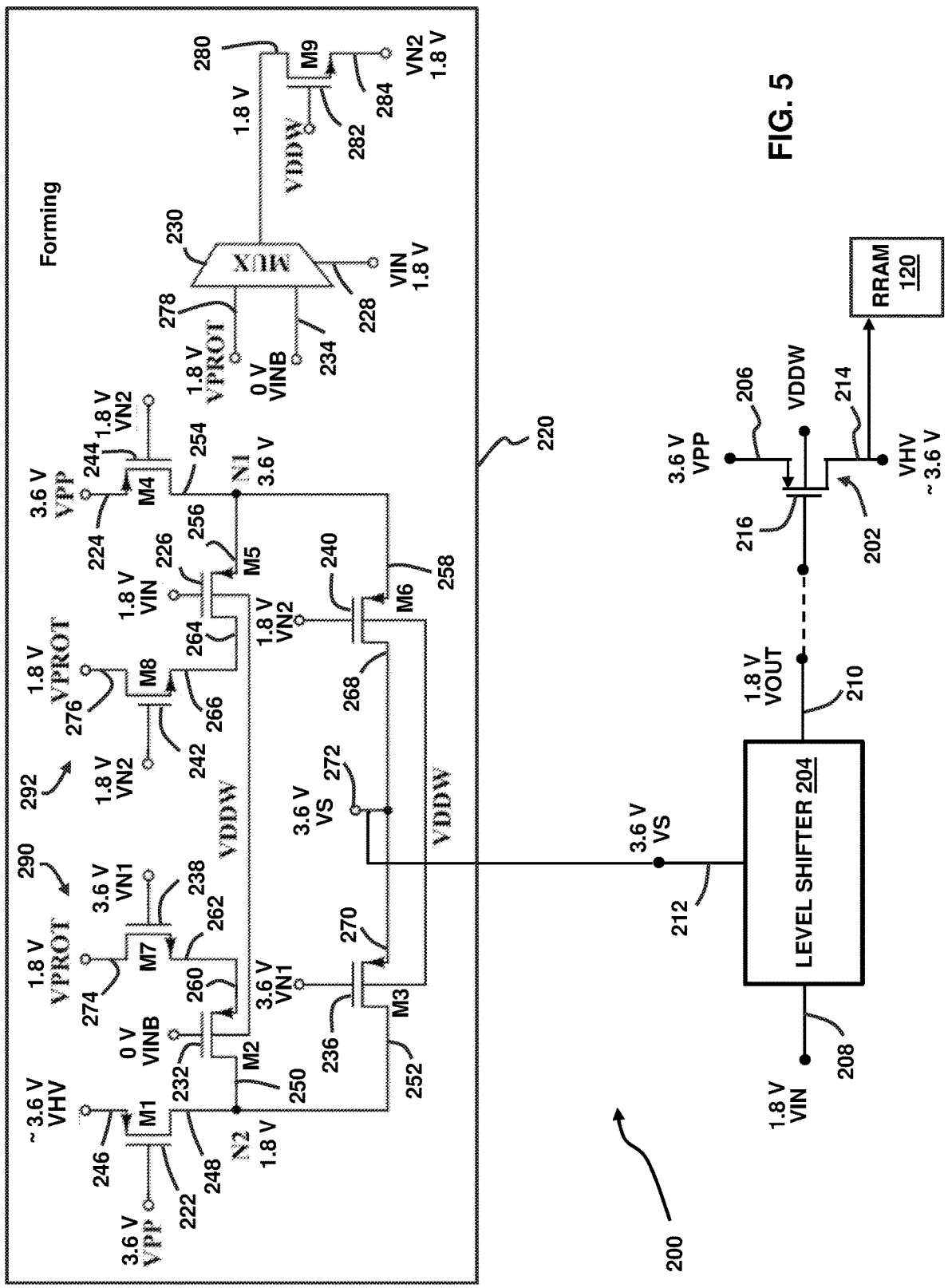
FIG. 5 depicts the high voltage power switch of FIG. 3 during an RRAM forming process according to embodiments of the disclosure.
Figure 6:
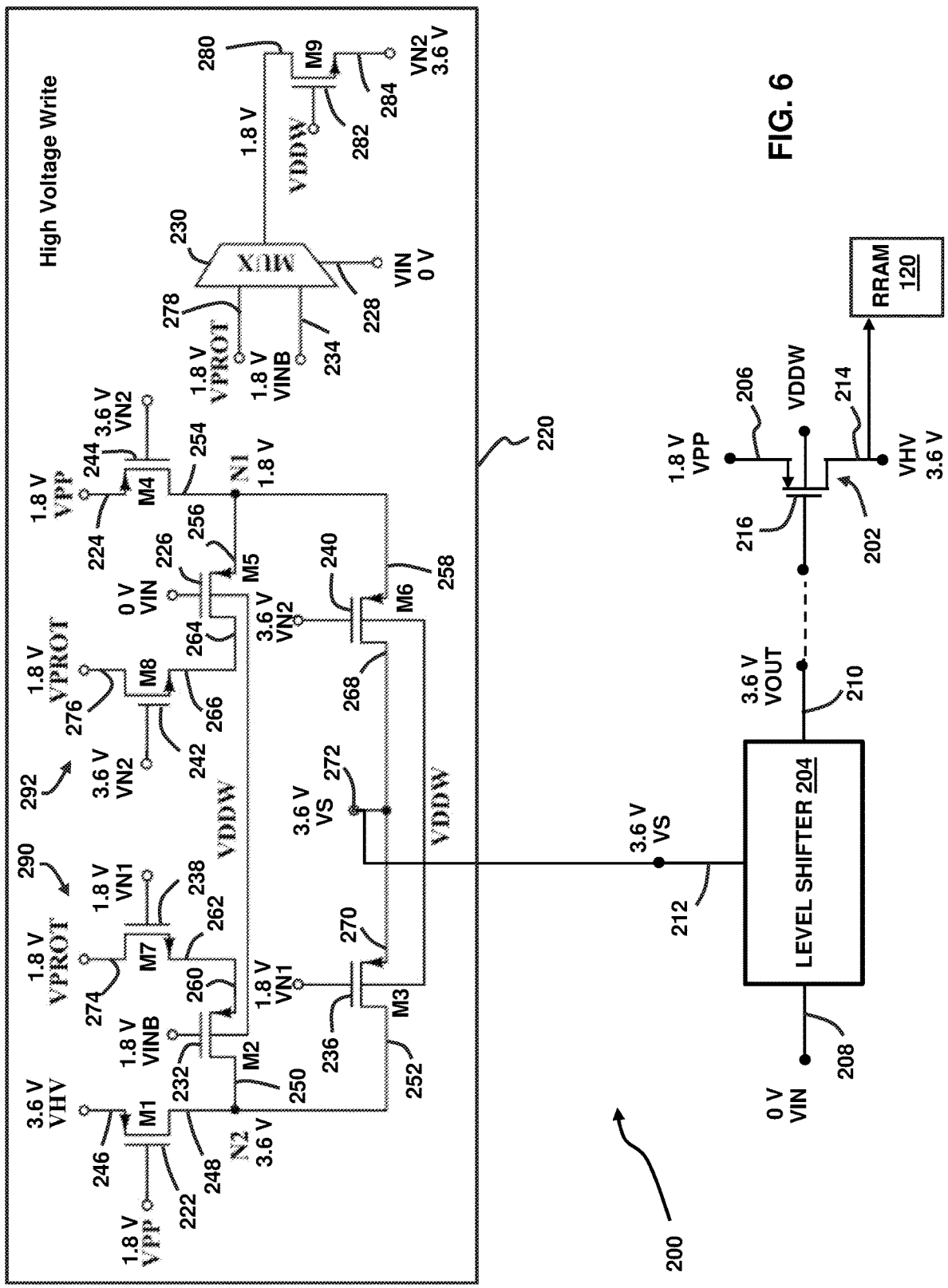
FIG. 6 depicts the high voltage power switch of FIG. 3 during an RRAM high voltage writing process according to embodiments of the disclosure.
Figure 7:
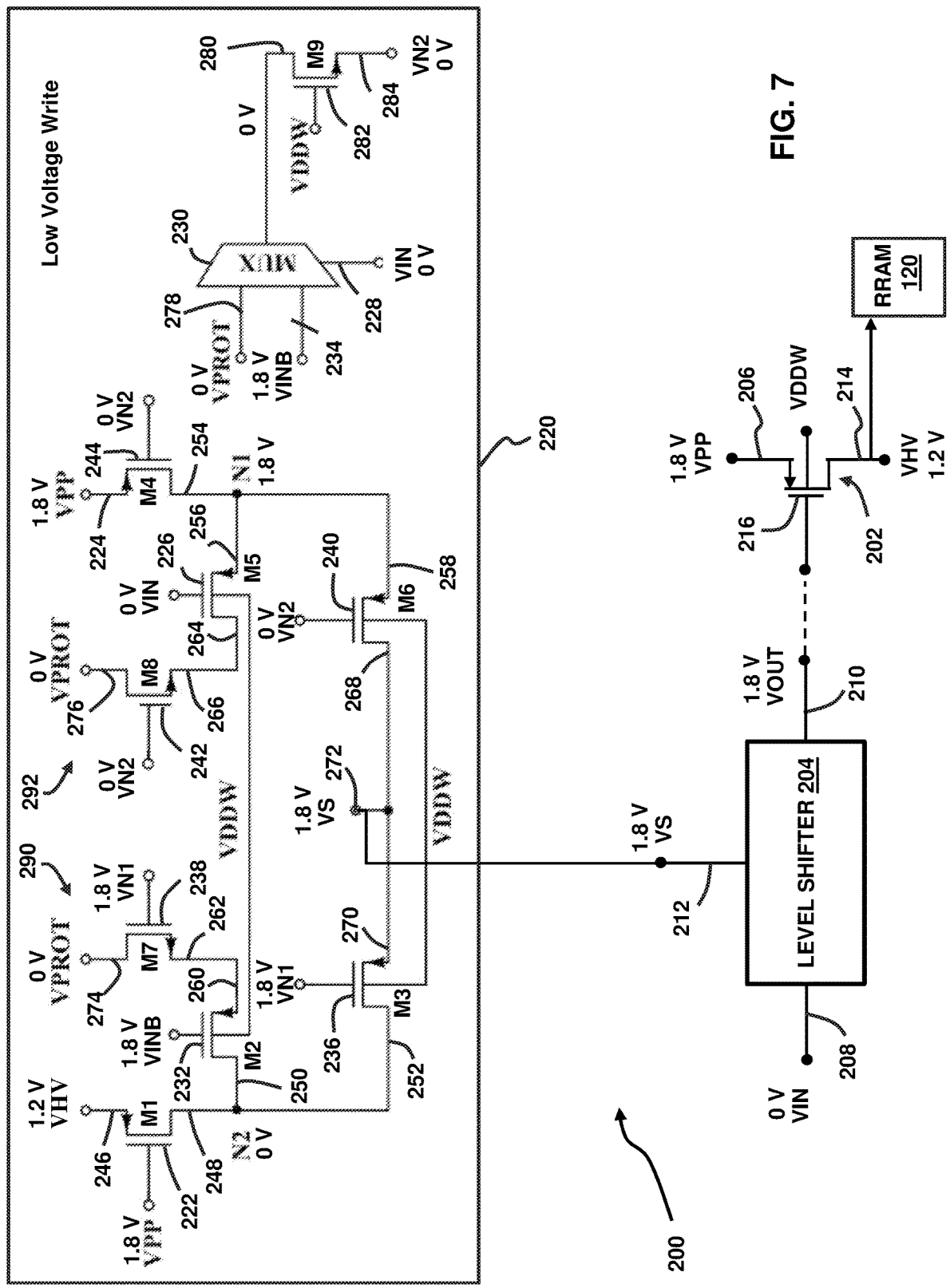
FIG. 7 depicts the high voltage power switch of FIG. 3 during an RRAM low voltage writing process according to embodiments of the disclosure.

Examples of the operation of the power switch 200 during RRAM forming, low voltage writing, and high voltage writing processes according to embodiments of the disclosure is depicted in FIGS. 5-7, respectively.

In FIG. 5, during the forming process, the NFET M7 and the PFET M2 are ON. To this extent, the voltage VN2 at node N2 is at 1.8 V. In addition, the PFET M4 is ON and the voltage VN1 at node N1 is at 3.6 V. The PFET M6 is also ON and the voltage VN1 (3.6 V) at node N1 is therefore passed to node 272 and the voltage supply node 212 of the level shifter 204. The output of the MUX is 1.8 V and the NFET M9 is OFF. Examining the voltages throughout the power switch 200, it can be seen that none of the PFETs M1-M6 and NFETs M7-M9 in the selection circuit 220 have exceeded their maximum voltage rating of 1.8 V during the forming process.

During the forming process, the input node 208 of the level shifter 204 receives an input voltage VIN of 1.8 V and the voltage supply node 212 receives the supply voltage VS of 3.6 V from the selection circuit 220. In response, the level shifter 204 is configured to supply an output voltage VOUT of 1.8 V to the gate 216 of the PFET 202. As such, the PFET 202 is ON during the forming process and current flows from the source 206 to the drain 216 of the PFET 202. According to embodiments of the disclosure, the voltage at the PFET 202 does not exceed its maximum voltage rating of 1.8 V during the forming process.

In FIG. 6, during the high voltage writing process, the NFET M8 and the PFET M5 are ON. To this extent, the voltage VN1 at node N1 is 1.8 V. In addition, the PFET M1 is ON and the voltage VN2 at node N2 is at 3.6 V. The PFET M3 is also ON and the voltage VN2 (3.6 V) at node N2 is therefore passed to node 272 and the voltage supply node 212 of the level shifter 204. The output of the MUX 230 is 1.8 V and the NFET M9 is OFF. Examining the voltages throughout the power switch 200, it can be seen that none of the PFETs M1-M6 and NFETs M7-M9 in the selection circuit 220 have exceeded their maximum voltage rating of 1.8 V during the high voltage writing process.

During the high voltage writing process, the input node 208 of the level shifter 204 receives an input voltage VIN of 0 V and the voltage supply node 212 receives the supply voltage VS of 3.6 V from the selection circuit 220. In response, the level shifter 204 is configured to supply an output voltage VOUT of 3.6 V to the gate 216 of the PFET 202. As such, the PFET 202 is OFF during the high voltage writing process and no current flows from the source 206 to the drain 216 of the PFET 202. Again, the voltage at the PFET 202 does not exceed its maximum voltage rating of 1.8 V during the high voltage writing process.

In FIG. 7, during the low voltage writing process, the PFET M4 is ON and the voltage VN1 at node N1 is at 1.8 V. The PFET M6 is ON, thereby passing the voltage VN1 (1.8 V) at node N1 to node 272 and the voltage supply node 212 of the level shifter 204. The output of the MUX is 0 V and the NFET M9 is ON such that the voltage VN2 at the source 284 of the NFET M9 and at node N2 is 0 V. Once again, it can be seen that none of the PFETs 102, M1-M6 and NFETs M7-M9 in the selection circuit 220 of the power switch 200 have exceeded their maximum voltage rating of 1.8 V during the low voltage writing process.

During the low voltage writing process, the input node 208 of the level shifter 204 receives an input voltage VIN of 0 V and the voltage supply node 212 receives the supply voltage VS of 1.8 V from the selection circuit 220. In response, the level shifter 204 is configured to supply an output voltage VOUT of 1.8 V to the gate 216 of the PFET 202. As such, the PFET 202 is OFF during the low voltage writing process and no current flows from the source 206 to the drain 216 of the PFET 202. Once again, the voltage at the PFET 202 does not exceed its maximum voltage rating of 1.8 V during the low voltage writing process.

Conventional high power switches may include a plurality of level shifters, a plurality of PFET power switches, and at least one biasing circuit. Such conventional high power switches may be implemented using a combination of low power transistors and high power transistors, where some of the low power transistors operate outside of their SOA. On an IC, such conventional high power switches may require a large area. Contrastingly, according to embodiments of the disclosure, the power switch 100 includes one level shifter 104 and one switching PFET 102, which operates within its SOA. Similarly, the power switch 200 includes one level shifter 204, one switching PFET 202, and a plurality of PFETs M1-M6 and NFETs M7-M9 in the selection circuit 220. Advantageously, the switching PFET 202, as well the plurality of PFETs M1-M6 and NFETs M7-M9 in the selection circuit 220, all operate within their SOA. In addition, the power switches 100, 200 may be implemented using significantly less area (e.g., 25%-33% less area) on an IC when compared to conventional high power switches.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A power switch, comprising:
   a P-type field effect transistor (PFET) including a gate, a source coupled to a source voltage, and a drain for outputting a supply voltage; and
   a level shifter, wherein the level shifter includes:
      an input node for receiving an input voltage, wherein the input voltage includes first and second voltage levels;
      a supply node for receiving the supply voltage, wherein the supply voltage includes third and fourth voltage levels; and
      an output node for outputting an output voltage, wherein the output node is coupled to the gate of the PFET;
   wherein, when the input voltage is at the first voltage level, the output voltage is at the first voltage level and the PFET is in a conducting state;
   wherein a voltage between the gate and the drain of the PFET and a voltage between the gate and the source of the FET do not exceed a maximum voltage rating of the PFET;
   when the input voltage is at the second voltage level and the supply voltage is at the third voltage level, the output voltage is at the third voltage level and the PFET is in a non-conducting state; and
   when the input voltage is at the second voltage level and the supply voltage is at the fourth voltage level, the output voltage is at the fourth voltage level and the PFET is in a non-conducting state.

2. The power switch according to claim 1, wherein:
   when the input voltage is at the first voltage level, the source voltage at the source of the PFET is at the third voltage level; and
   when the input voltage is at the second voltage level, the source voltage at the source of the PFET is at the first voltage level.

3. The power switch according to claim 1, wherein the power switch is coupled to a resistive random access memory (RRAM).

4. The power switch according to claim 3, wherein a forming voltage of the RRAM is at the third voltage level, a first writing voltage of the RRAM is at the third voltage level, and a second writing level of the RRAM is at the first voltage level.

5. The power switch according to claim 4, wherein the first writing voltage is greater than the second writing voltage.

6. A power switch, comprising:
   a P-type field effect transistor (PFET) including a gate, a source coupled to a source voltage, and a drain for outputting a first supply voltage;
   a level shifter, wherein the level shifter includes:
      an input node for receiving an input voltage, wherein the input voltage includes first and second voltage levels;
      a supply node for receiving a second supply voltage, wherein the second supply voltage includes third and fourth voltage levels; and
      an output node for outputting an output voltage, wherein the output node is coupled to the gate of the PFET; and
   a voltage selection circuit for providing the second supply voltage;
   wherein, when the input voltage is at the first voltage level, the output voltage is at the first voltage level and the PFET is in a conducting state; and
   wherein a voltage between the gate and the drain of the PFET and a voltage between the gate and the source of the PFET do not exceed a maximum voltage rating of the PFET.

7. The power switch according to claim 6, wherein:
   when the input voltage is at the second voltage level and the second supply voltage is at the third voltage level, the output voltage is at the third voltage level and the PFET is in a non-conducting state; and
   when the input voltage is at the second voltage level and the second supply voltage is at the fourth voltage level, the output voltage is at the fourth voltage level and the PFET is in a non-conducting state.

8. The power switch according to claim 6, wherein:
   when the input voltage is at the first voltage level, the source voltage at the source of the PFET is at the third voltage level; and
   when the input voltage is at the second voltage level, the source voltage at the source of the PFET is at the first voltage level.

9. The power switch according to claim 6, wherein:
   the first supply voltage includes the third voltage level and a fifth voltage level;
   wherein, when the input voltage is at the first voltage level, the first supply voltage is at the third voltage level; and
   wherein, when the input voltage is equal to the second voltage level, the first supply voltage is at the fifth voltage level.

10. The power switch according to claim 9, wherein the voltage selection circuit comprises:
   a first PFET;
   a second PFET;

a first protection circuit coupled to the first PFET at a first node;
a second protection circuit coupled to the second PFET at a second node;
a third PFET coupled between the first node and a voltage output node;
a fourth PFET coupled between the second node and the voltage output node and coupled to the third PFET;
wherein the voltage output node of the voltage selection circuit is coupled to the supply node of the level shifter.

11. The power switch according to claim 10, wherein:
a source of the first PFET is coupled to the first supply voltage;
a gate of the first PFET is coupled to the source voltage;
a drain of the first PFET is coupled to the first node;
a source of the second PFET is coupled to the source voltage;
a gate of the second PFET is coupled to the first node; and
a drain of the second PFET is coupled to the second node.

12. The power switch according to claim 10, wherein:
a source of the third PFET is coupled to a drain of the fourth PFET and the voltage output node;
a gate of the third PFET is coupled to the second node;
a drain of the third PFET is coupled to the first node;
a source of the fourth PFET is coupled to the second node; and
a gate of the fourth PFET is coupled to the first node.

13. The power switch according to claim 10, wherein:
the first protection circuit includes:
 a first NFET; and
 a fifth PFET coupled to the first NFET and the first node; and the second protection circuit includes:
 a second NFET; and
 a sixth PFET coupled to the second NFET and the second node.

14. The power switch according to claim 13, wherein:
a drain of the first NFET is coupled to a protection voltage;
a gate of the first NFET is coupled to the second node;
a source of the first NFET is coupled to a source of the fifth PFET;
a gate of the fifth PFET is coupled to an inverse of the input voltage; and
a drain of the fifth PFET is coupled to the first node.

15. The power switch according to claim 13, wherein:
a drain of the second NFET is coupled to a protection voltage;
a gate of the second NFET is coupled to the first node;
a source of the second NFET is coupled to a drain of the sixth PFET;
a gate of the sixth PFET is coupled to the input voltage; and
a source of the sixth PFET is coupled to the second node.

16. The power switch according to claim 6, wherein the power switch is coupled to a resistive random access memory (RRAM).

17. The power switch according to claim 16, wherein a forming voltage of the RRAM is at the third voltage level, a first writing voltage of the RRAM is at the third voltage level, and a second writing level of the RRAM is at the fifth voltage level.

18. The power switch according to claim 17, wherein the first writing voltage is greater than the second writing voltage.

* * * * *